(12) United States Patent
Duong et al.

(10) Patent No.: US 9,399,753 B2
(45) Date of Patent: Jul. 26, 2016

(54) AQUA REGIA AND HYDROGEN PEROXIDE HCL COMBINATION TO REMOVE NI AND NIPT RESIDUES

(71) Applicants: Intermolecular Inc., San Jose, CA (US); GLOBALFOUNDRIES, Inc., Grand Cayman (KY)

(72) Inventors: Anh Duong, Fremont, CA (US); Clemens Fitz, Dresden (DE); Olov Karlsson, San Jose, CA (US)

(73) Assignees: Intermolecular, Inc., San Jose, CA (US); GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/574,995

(22) Filed: Dec. 18, 2014

(65) Prior Publication Data

US 2015/0105308 A1 Apr. 16, 2015

Related U.S. Application Data

(63) Continuation of application No. 14/333,715, filed on Jul. 17, 2014, now Pat. No. 8,946,015, which is a continuation of application No. 13/953,446, filed on Jul. 29, 2013, now Pat. No. 8,809,140, which is a continuation of application No. 13/489,244, filed on Jun. 5, 2012, now Pat. No. 8,518,765.

(51) Int. Cl.

| | |
|---|---|
| C11D 11/00 | (2006.01) |
| H01L 29/66 | (2006.01) |
| H01L 21/02 | (2006.01) |
| H01L 21/28 | (2006.01) |
| H01L 21/324 | (2006.01) |
| H01L 29/49 | (2006.01) |
| C11D 7/04 | (2006.01) |
| C11D 7/08 | (2006.01) |
| C11D 7/26 | (2006.01) |
| H01L 21/67 | (2006.01) |

(52) U.S. Cl.
CPC .............. *C11D 11/0047* (2013.01); *C11D 7/04* (2013.01); *C11D 7/08* (2013.01); *C11D 7/265* (2013.01); *H01L 21/02057* (2013.01); *H01L 21/02068* (2013.01); *H01L 21/28052* (2013.01); *H01L 21/324* (2013.01); *H01L 21/6704* (2013.01); *H01L 29/4975* (2013.01); *H01L 29/665* (2013.01); *H01L 29/66477* (2013.01); *H01L 29/66568* (2013.01)

(58) Field of Classification Search
CPC .............. H01L 21/288; H01L 21/8221; H01L 21/02068; H01L 21/28518; H01L 21/30604; H01L 21/32134
See application file for complete search history.

(56) References Cited

U.S. PATENT DOCUMENTS

| | | | | |
|---|---|---|---|---|
| 4,111,851 | A * | 9/1978 | Shai | 252/519.54 |
| 5,337,207 | A * | 8/1994 | Jones et al. | 361/321.1 |
| 2005/0274396 | A1* | 12/2005 | Shih et al. | 134/29 |
| 2008/0090369 | A1* | 4/2008 | Akiyama et al. | 438/308 |
| 2010/0240213 | A1* | 9/2010 | Urano et al. | 438/652 |

* cited by examiner

*Primary Examiner* — Kyoung Lee

(57) ABSTRACT

A method for cleaning residues from a semiconductor substrate during a nickel platinum silicidation process is disclosed, including a multi-step residue cleaning, including exposing the substrate to an aqua regia solution, followed by an exposure to a solution having hydrochloric acid and hydrogen peroxide. The SC2 solution can further react with remaining platinum residues, rendering it more soluble in an aqueous solution and thereby dissolving it from the surface of the substrate.

13 Claims, 6 Drawing Sheets

AQUA REGIA AND HYDROGEN PEROXIDE HCL COMBINATION TO REMOVE NI AND NIPT RESIDUES

RELATED APPLICATIONS

This application is a continuation and claims priority to U.S. patent application Ser. No. 14/333,715, filed 17 Jul. 2014, which is a continuation and claims priority to U.S. patent application Ser. No. 13/953,446, filed 29 Jul. 2013 (now U.S. Pat. No. 8,809,140), which is a continuation and claims priority to U.S. patent application Ser. No. 13/489,244, filed 5 Jun. 2012 (now U.S. Pat. No. 8,518,765), each of which is entirely incorporated by reference herein for all purposes. This application is also related to U.S. application Ser. No. 13/094,967 filed on Apr. 27, 2011 (now U.S. Pat. No. 8,894,774); to U.S. application Ser. No. 13/276,973 filed on Oct. 19, 2011 (now U.S. Pat. No. 8,784,572); to U.S. application Ser. No. 13/296,444 filed on Nov. 14, 2011 (now U.S. Pat. No. 8,513,117); to U.S. application Ser. No. 13/292,906 filed on Nov. 9, 2011 (now U.S. Pat. No. 8,697,573); and to U.S. application Ser. No. 13/295,333 filed on Nov. 14, 2011 (now U.S. Pat. No. 8,466,058), each of which is also incorporated by reference herein for all purposes.

TECHNICAL FIELD

Provided are methods of forming silicides, and more particularly to methods of removing nickel and platinum residues.

BACKGROUND OF THE INVENTION

Silicide processes have been used to improve the conductivity of polysilicon gate and source/drain regions at the transistor level of an integrated circuit. The silicide layer provides a good ohmic contact at the interface of the gate and source/drain electrodes and the metal interconnects, reducing the contact resistance of the electrodes. The silicide materials have been changed from titanium silicide at above 130 nm device dimensions, to cobalt silicide at between 90 nm to 130 nm device dimensions, to nickel silicide at between 65 nm to 90 nm device dimensions, and now to nickel platinum silicide for device dimensions below 65 nm.

Advanced semiconductor fabrication processes currently use nickel and nickel alloy silicide due to their low electrical resistivity, low silicon consumption, good resistance behavior in narrow lines, and low processing temperature. A conventional method of forming a nickel silicide includes depositing a nickel layer on a semiconductor wafer, followed by a first rapid thermal process (RTP) at low temperatures of about 300 C to react nickel with silicon to produce high resistance nickel silicide phase $Ni_2Si$ or NiSi. A selective etching process is performed to remove the unreacted nickel layer, and a second RTP at higher temperatures of about 450 C is performed to convert high resistance nickel silicide phase $Ni_2Si$ or NiSi to low resistance nickel silicide phase $NiSi_2$.

A challenge of nickel silicide is the potential spiking effect, together with possible lateral diffusion to the channel region. Thus nickel alloy silicide, especially nickel platinum silicide, has been used to improve the thermal stability of nickel silicide. For example, nickel platinum silicide with 5 to 10 atomic percent (at %) platinum content can increase the silicide nucleation temperature to 900 C and the agglomeration temperature to 750 C, while still retaining the same conductivity as that of pure nickel silicide. However, platinum is difficult to etch, resulting in potential platinum residue issues during the removal of the unreacted metal layer.

Therefore, etch solutions and methods are needed to effectively remove advanced materials (e.g., nickel and platinum) during semiconductor processing and manufacturing.

SUMMARY OF THE DESCRIPTION

In some embodiments, the present invention discloses a cleaning process to remove nickel and platinum residues using a combination of chemicals that can react to generate chlorine-containing gas either in gaseous form or dissolved in a fluid. The chlorine-containing gas can convert platinum to a more soluble state which can facilitate the residue removal.

In some embodiments, the present invention discloses a cleaning process using a sequential application of dilute aqua regia and a mixture of hydrochloric acid and hydrogen peroxide. The dilute aqua regia can remove nickel and convert platinum to a soluble state. The mixture of hydrochloric acid and hydrogen peroxide can react to generate dissolved chlorine gas, which can remove nickel, platinum and nickel/platinum residues that still remain after the aqua regia cleaning process. For example, dissolved chlorine gas generated in the mixture can further oxidize the soluble chloroplatinous acid ($H_2PtCl_4$) to chloroplatinic acid ($H_2PtCl_6$), which is one of the most soluble platinum forms of $Pt^{4+}$.

In some embodiments, the present invention discloses methods to form nickel platinum silicide, comprising depositing a layer of nickel platinum on a silicon substrate, or a substrate comprising at least a silicon or germanium region. After performing a first rapid thermal process to react nickel and platinum with silicon to form nickel platinum silicide, the substrate is exposed to a first solution of dilute nitric acid. The dilute nitric acid can remove the unreacted nickel and platinum. After performing a second rapid thermal process to convert nickel platinum silicide to low resistant nickel platinum silicide phase, the substrate is exposed to a second solution of dilute aqua regia to further remove the remaining nickel and platinum. The substrate is then exposed to a mixture of hydrochloric acid and hydrogen peroxide to further remove the remaining platinum residues.

In some embodiments, the present invention discloses methods to form a semiconductor device, comprising forming a transistor structure on a semiconductor substrate and forming a nickel platinum silicide on at least a gate electrode or a source/drain region of the transistor structure.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1A:
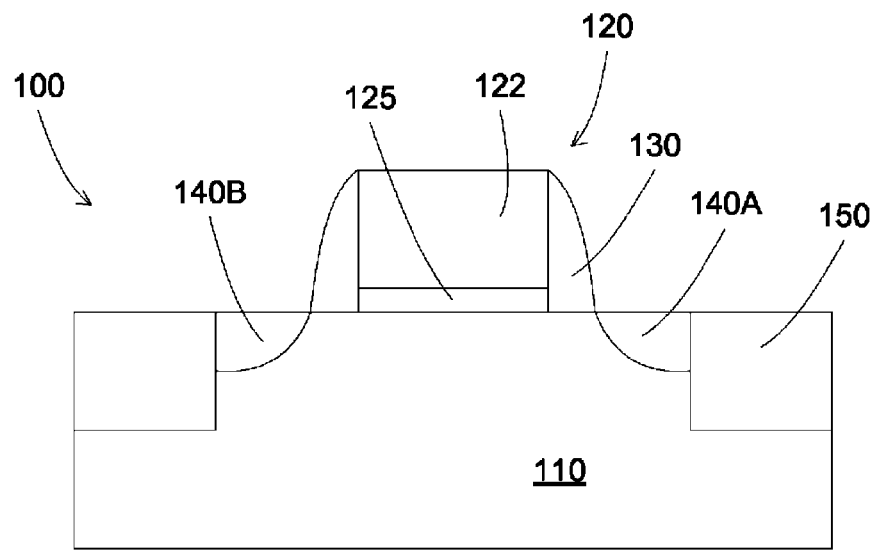
FIGS. 1A-1E illustrate an illustrative process flow for forming a semiconductor device according to some embodiments of the present invention.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, the present invention discloses a process to remove nickel and platinum residues on a semiconductor surface using a combination of chemicals that can react to generate chlorine-containing gas either in gaseous form or dissolved in a fluid. The chlorine-containing gas can convert platinum to a more soluble state which can facilitate the residue removal. For example, a mixture of hydrochloric acid and hydrogen peroxide (commonly called Standard Clean 2 or SC2 in semiconductor industry) can generate chlorine gas during the mixing.

Aqua regia (etching solution comprising $HNO_3+NCl$) can be used to etch platinum in unreacted nickel platinum metal layer. Platinum metal can be oxidized by the oxidant to form platinum ions, which are then reacted with chloride ions to form soluble hexachloroplatinic acid.

Generally, platinum solid can be dissolved, by reacting with nitric acid to form platinum ions $Pt^{4+}$, $$3Pt(s)+4NO_3^-(aq)+16H^+(aq) \rightarrow 3Pt^{4+}(aq)+4NO(g)+8H_2O(l)$$

The oxidized platinum ions then react with chlorine ions $Cl^-$ to form soluble chloroplatinate ions $PtCl_6^{2-}$, which is one of the most soluble forms of platinum ions:

$$Pt^{4+}(aq)+6Cl^-(aq) \rightarrow PtCl_6^{2-}(aq)$$

However, the reaction of platinum with aqua regia is considerably more complex. For example, mixed phases of nickel platinum silicide can be formed at various RTP temperatures, with lower RTP temperatures resulting in a higher proportion of metal-rich silicide phases, which are less susceptible to be removed by aqua regia. Further, aqua regia is known to degrade nickel platinum silicide quality, especially for two step thermal processes.

In general, chlorine ions can react with platinum ions to form different chloro-platinum compounds with different degrees of solubility. For example, platinum reacting with aqua regia can additionally produce the less soluble chloroplatinous acid $H_2PtCl_4$:

$$Pt(s)+2HNO_3(aq)+4HCl(aq) \rightarrow (NO)_2PtCl_4(s)+3H_2O(l)+½O_2(g)$$

$$(NO)_2PtCl_4(s)+2HCl(aq) \rightarrow H_2PtCl_4(aq)+2NOCl(g)$$

Thus cleaning platinum residues with aqua regia might be incomplete, leaving platinum residues on the semiconductor surface.

In some embodiments, the present invention discloses exposing a nickel platinum surface to a gaseous chlorine to provide full dissolution of platinum, for example, by converting the less soluble chloroplatinous acid $H_2PtCl_4$ to the more soluble hexachloroplatinic acid $H_2PtCl_6$:

$$H_2PtCl_4(aq)+Cl_2(g) \rightarrow H_2PtCl_6(aq)$$

In some embodiments, the present invention discloses exposing a nickel platinum surface to a mixture of chemicals that can generate gaseous chlorine. In some embodiments, the present invention discloses exposing the surface to a mixture of hydrogen peroxide and hydrochloric acid, which can form chlorine during the mixing:

$$H_2O_2(aq)+HCl(aq) \rightarrow Cl_2(g)+2H_2O(aq)$$

In some embodiments, the mixture solution is heated to a temperature less than about 80 C, for example, between about 60 and about 80 C.

In some embodiments, the present invention discloses a process to remove nickel and platinum residues from a nickel platinum surface of a substrate by exposing the surface to a mixture of hydrogen peroxide and hydrochloric acid, which is commonly called SC2 or HPM (hydrochloric acid-hydrogen peroxide-water mixture). In some embodiments, the nickel platinum surface can be first exposed to aqua regia, e.g., a solution comprising a mixture of nitric acid and hydrochloric acid. The aqua regia can remove nickel and platinum residues from the surface. In some embodiments, the nickel platinum surface can be additionally or alternatively exposed to a dilute nitric acid solution, a sulfuric acid solution, or a sulfuric peroxide solution (comprising a mixture of sulfuric acid and hydrogen peroxide) to remove nickel and some portion of platinum. For example, the nickel platinum surface can be exposed to a sequence of a sulfuric peroxide solution followed by an aqua regia solution; or a dilute nitric acid followed by an aqua regia solution. Afterward, the nickel platinum surface can be exposed to a mixture of hydrogen peroxide and hydrochloric acid, which can remove the remaining residues.

In some embodiments, the present invention discloses a process to remove nickel and platinum residues using dilute aqua regia solution and a mixture of hydrogen peroxide and hydrochloric acid. In some embodiments, the aqua regia solution and the a mixture of hydrogen peroxide and hydrochloric acid are applied in sequence after thermal processing, where the aqua regia etches nickel and platinum, and the a mixture of hydrogen peroxide and hydrochloric acid further dissolves remaining platinum.

In some embodiments, the present invention discloses a nickel and platinum cleaning process using a two step cleaning process where the first cleaning step etches platinum, and the second cleaning step cleans any remaining platinum not etched by the first cleaning step. For example, the first cleaning step can be performed after a rapid thermal process, reacting nickel and platinum with silicon to form nickel platinum silicide. In addition the first cleaning steps can be tailored to convert the platinum to a more soluble state which can facilitate the second cleaning step.

In some embodiments, the first cleaning step includes exposing the substrate to an aqua regia solution to etch nickel. Aqua regia also includes nitric acid, which is an oxidant acid, and thus can partially oxidize platinum, for example, to platinum $Pt^{4+}$, which has high solubility in hydrochloric acid. The remaining platinum that has not been dissolved in aqua regia is then subjected to the second cleaning step using a mixture of hydrogen peroxide and hydrochloric acid to dissolve the remaining platinum.

In some embodiments, the present invention discloses a process of removing nickel and platinum residues using dilute nitric acid, dilute aqua regia, and a mixture of hydrogen peroxide and hydrochloric acid. In some embodiments, the dilute nitric acid, dilute aqua regia, and mixture of hydrogen peroxide and hydrochloric acid are applied in sequence after thermal processing, where the dilute nitric acid mainly etches nickel, the aqua regia mainly dissolves platinum, and the mixture of hydrogen peroxide and hydrochloric acid further dissolves remaining platinum.

In some embodiments, the separation of etching materials, e.g., nickel etching in a first dilute nitric acid and platinum etching in a second aqua regia solution, can be effective in removing nickel and platinum residue while preventing damage to the substrate. For example, platinum is unreactive and generally needs to be oxidized to platinum ions, which then can be dissolved in chlorine-based chemistries, such as an aqua regia solution to form soluble hexachloroplatinic acid ($H_2PtCl_6$). However, platinum can be oxidized to various oxidation states, such as $Pt^+$, $Pt^{3+}$, or $Pt^{4+}$, each with different solubility in chlorine-based chemistries. For example, the $Pt^+$ and $Pt^{3+}$ oxidation states are harder to dissolve than the $Pt^{4+}$ oxidation state, and thus directly dissolving multiple oxidation states of platinum ions in aqua regia may need high concentration of hydrochloric acid, such as a typical aqua regia solution of about 30 wt % hydrochloric acid and about 14 wt % nitric acid. The high concentration aqua regia, though effective in dissolving platinum, can also cause damage to the device. Alternatively, platinum can be dissolved in strong oxidant chemistries, such as a sulfuric peroxide mixture, but the strong oxidant etching of platinum tends to be incomplete, leaving platinum residues. In the present specification, the terms "platinum etch," "platinum removal" and "platinum dissolving" all refer to removing platinum from the surface of the substrate. Further, the present specification discloses a mixture of hydrogen peroxide and hydrochloric acid, but the invention is not so limited, and any mixture of chemicals that can generate chlorine upon mixing can be used.

In some embodiments, the present invention discloses a nickel and platinum cleaning process using a three step cleaning process where the first cleaning step mainly etches nickel, the second cleaning step mainly etches platinum, and the third cleaning step cleans any remaining platinum. For example, the first and second cleaning steps can be performed after a rapid thermal process, reacting nickel and platinum with silicon to form nickel platinum silicide. In addition the first and second cleaning steps can be tailored to convert the platinum to a more soluble state which can facilitate the third cleaning step.

In some embodiments, the first cleaning step comprises an acid, such as dilute nitric acid, to etch nickel. Nitric acid is also an oxidant acid, and thus can partially oxidize platinum, for example, to platinum $Pt^{4+}$, which has high solubility in hydrochloric acid. The high solubility platinum is then subjected to the second cleaning step using an aqua regia solution, dissolving the platinum. With some platinum already converted to $Pt^{4+}$ by the nitric acid in the first step, the aqua regia solution can be more dilute and still effective at removing platinum. In some embodiments, the dilute aqua regia can be more dilute than a conventional aqua regia solution, for example, up to 2× more dilute in nitric acid and hydrochloric acid.

In some embodiments, the present invention discloses a method for cleaning residues from a surface of a substrate, including exposing the surface, after a rapid thermal process, to a first solution containing a mixture of nitric acid and hydrochloric acid. Subsequently, the surface is exposed to a second solution containing dissolved chlorine gas.

In some embodiments, the present invention discloses a method for cleaning residues from a surface of a substrate, including exposing the surface, after a first rapid thermal process, to a first solution comprising dilute nitric acid, wherein the first solution does not comprise a chlorine-based acid. Subsequently, the surface is exposed, after a second rapid thermal process, to a second solution containing a mixture of nitric acid and hydrochloric acid. Afterward, the surface is exposed to a third solution containing a mixture of hydrogen peroxide and hydrochloric acid.

In some embodiments, the mixture of hydrogen peroxide and hydrochloric acid is heated to a temperature of about 80 C, for example to between about 60 C and about 100 C.

In some embodiments, the concentration of the dilute nitric acid in the first cleaning solution is less than about 20 wt %, and more specifically less than about 10 wt %. The concentration of dilute nitric acid may be greater than about 2 or about 3 wt %. In some embodiments, the concentration of the nitric acid in dilute aqua regia is less than about 15 wt % and more specifically less than about 10 wt % and the concentration of the hydrochloric acid in dilute aqua regia is less than about 20 wt % and more specifically less than about 16 wt %. For example, the dilute aqua regia can include less than about 10 wt % nitric acid and less than about 20 wt % hydrochloric acid. Alternatively, the dilute aqua regia can include less than about 15 wt % nitric acid with less than about 16 wt % hydrochloric acid.

In some embodiments, the composition of the solution is about 1:1:5 or about 1:1:6, which corresponds one part of hydrogen peroxide, one part of hydrochloric acid, and 5 or 6 parts of water. The concentration of hydrogen peroxide in the mixture can be less than or equal to about 20 wt % or 25 wt %. The concentration of hydrochloric acid in the mixture can be less than or equal to about 20 wt % or 25 wt %.

In some embodiments, the cleaning process is performed for less than about 10 minutes, more specifically for about 5 minutes or less. The temperature of the solution, e.g., the dilute nitric acid, the dilute aqua regia, or the mixture of hydrogen peroxide and hydrochloric acid, can be less than or equal to about 80 C or less than about 60 C. In some embodiments, a water rinse is performed after the cleaning steps. For example, the surface is rinsed with water after being exposed to dilute nitric acid, after being exposed to dilute aqua regia solution, or after being exposed to the mixture of hydrogen peroxide and hydrochloric acid.

In some embodiments, the cleaning solution of dilute nitric acid in the first cleaning step does not include chlorine-based acid. This solution can include a non-chlorine chemical, such as a solvent, an acid comprising fluorine (e.g., HF), or an organic acid (e.g., acetic acid or carbonyl acid).

In some embodiments, the present invention discloses methods to form nickel platinum silicide, using a two step cleaning process to remove nickel and platinum residues. The first cleaning step mainly etches nickel and platinum, including a first solution containing an aqua regia solution, with the nitric acid component in the aqua regia solution oxidizing the platinum residues and the hydrochloric acid element in the aqua regia solution reacting with the oxidized platinum to form various forms of soluble chloro-platinum acid. The second step cleans remaining platinum residues, including a second solution containing a mixture of hydrogen peroxide and hydrochloric acid.

In some embodiments, the present invention discloses methods to form a nickel platinum silicide, including providing a substrate having at least one silicon-containing region.

For example, the silicon-containing region can be a polysilicon gate electrode or a silicon germanium source or drain region. A layer including nickel and platinum is then formed on the substrate, for example, by a physical vapor deposition (PVD) process. A thermal process, e.g., a rapid thermal process (RTP), may be performed on the substrate including the nickel platinum layer, reacting the nickel and platinum with the silicon in the substrate to form nickel platinum silicide. The substrate is then exposed to a first cleaning solution including aqua regia containing dilute nitric acid and hydrochloric acid, for example, to remove nickel and platinum residues from the nickel platinum layer. Afterward, the substrate is exposed to a mixture of hydrogen peroxide and hydrochloric acid, cleaning any remaining residues of platinum.

In some embodiments, the present methods involve other features described above, such as composition of the mixture of hydrogen peroxide and hydrochloric acid, temperature, concentration, and cleaning time.

In some embodiments, the rapid thermal process is performed at temperature between about 300 C to about 450 C for less than about 1 minute in nitrogen environment.

In some embodiments, the present invention discloses methods to form nickel platinum silicide, using a three step cleaning process to remove nickel and platinum residues. The first cleaning step mainly etches nickel, comprising a first solution comprising nitric acid without any chlorine-based acid (e.g., without hydrochloric acid). For example, the first solution can be dilute nitric acid. Alternatively, the first solution can be a mixture of nitric acid with a non-chlorine-based acid or non-chlorine-based chemical, such as a solvent, an acid comprising fluoride (e.g., HF), or an organic acid (e.g., acetic acid or carbonyl acid). The dilute nitric acid solution can also oxidize a portion of the platinum residues, rendering them easier to dissolve in the second cleaning solution. The process conditions of the first cleaning step can be optimized to facilitate the subsequent platinum removal process, for example, to oxidize platinum to $Pt^{4+}$, which can be easily reacted with chlorine-based chemistries to form soluble platinum compounds, instead of $Pt^+$ or $Pt^{3+}$, which can be harder to remove in the second cleaning step using dilute aqua regia. Further, the dilute nitric acid solution can be tailored to prevent damage to the substrate, for example, by employing cleaning solutions that are not designed to aggressively remove platinum.

The second cleaning step mainly removes platinum. For example, the second solution in the second step can comprise an aqua regia solution, with the nitric acid component in the aqua regia solution oxidizing the platinum residues and the hydrochloric acid element in the aqua regia solution reacting with the platinum to form soluble hexachloroplatinic acid. Further, the second cleaning step can be assisted by the oxidizing action of platinum in the first cleaning step through the dilute nitric acid. Therefore, the aqua regia solution can be made more dilute, for example, as compared to typical prior art aqua regia platinum etching of 14 wt % nitric acid and 30 wt % hydrochloric acid.

The third cleaning step mainly removes the remaining platinum after the first two cleaning steps. For example, the third solution in the third cleaning step can use a mixture of hydrogen peroxide and hydrochloric acid, which can generate chlorine gas to convert the less soluble chloroplatinous acid to the more soluble chloroplatinic acid.

In some embodiments, the present invention discloses methods to form a nickel platinum silicide, involving providing a substrate having at least one silicon-containing region. For example, the silicon-containing region can be a polysilicon gate electrode or a silicon germanium source or drain region. A layer including nickel and platinum is then formed on the substrate, for example, by a physical vapor deposition (PVD) process. A first thermal process, preferably a rapid thermal process (RTP), is performed on the substrate comprising the nickel platinum layer, reacting the nickel and platinum with the silicon in the substrate to form various phases of nickel platinum silicide. The substrate is then exposed to a first cleaning solution comprising dilute nitric acid, for example, to remove unreacted nickel (and/or platinum) from the nickel platinum layer. As disclosed above, the dilute nitric acid solution mainly removes nickel and partially oxidizes platinum. In some embodiments, some platinum can be dissolved or removed. A second thermal process, also preferably a rapid thermal process, is performed on the substrate comprising the nickel platinum silicide, to further react the various phases of nickel platinum silicide with silicon in the substrate to form low resistive nickel platinum silicide. The substrate is then exposed to a second cleaning solution comprising aqua regia comprising dilute nitric acid and hydrochloric acid, for example, to remove platinum residues from the remaining nickel platinum layer. For example, the nitric acid can oxidize platinum, and the hydrochloric acid can dissolve the oxidized platinum. As disclosed above, the present aqua regia solution can be more dilute, but still effective, than typical aqua regia used in cleaning nickel platinum residues, perhaps due to the prior oxidation of platinum to $Pt^{4+}$ by the first cleaning step using dilute nitric acid. Afterward, the substrate is exposed to a mixture of hydrogen peroxide and hydrochloric acid, cleaning any remaining residues of platinum.

In some embodiments, the present method involves other features described above such as composition of the mixture of hydrogen peroxide and hydrochloric acid, temperature, concentration, and cleaning time.

In some embodiments, the first rapid thermal process is performed at temperature below about 380 C, for example, at about 300 C for less than 1 minute in nitrogen ambient. In some embodiments, the second rapid thermal process is performed at temperature above about 300 C, for example, at about 450 C for less than 1 minute in nitrogen ambient.

In some embodiments, the cleaning solution of dilute nitric acid in the first cleaning step does not include chlorine-based acid. The solution can include a non-chlorine chemical, such as a solvent, an acid comprising fluorine (e.g., HF), or an organic acid (e.g., acetic acid or carbonyl acid).

In some embodiments, the present invention discloses methods to form a semiconductor device, involving forming at least a nickel platinum silicide contact for a transistor structure. The transistor structure can comprise a gate electrode and a source/drain region over a semiconductor substrate. The gate electrode can include an exposed doped polysilicon layer. The source/drain region can include an exposed silicon or silicon germanium area. A layer including nickel and platinum is then formed on the substrate, for example, by a physical vapor deposition process. The nickel platinum layer can be deposited on the exposed portions of the gate electrode and source/drain region, covering the gate electrode or the source/drain region.

An optional first rapid thermal process is performed on the substrate, reacting the nickel and platinum with the silicon in the gate electrode or the source/drain region to form various phases of nickel platinum silicide, such as nickel rich silicide. The substrate is then optionally exposed to a first cleaning solution comprising dilute nitric acid, for example, to remove unreacted nickel (and/or platinum) from the nickel platinum layer. A second thermal process, also preferably a rapid thermal process, is performed on the substrate including the nickel platinum silicide, to further react the various phases of nickel platinum silicide with silicon in the substrate to form low resistive nickel platinum silicide. The substrate is then exposed to a second cleaning solution including aqua regia containing dilute nitric acid and hydrochloric acid, for example, to remove platinum residues (including Pt or NiPt residues) from the remaining nickel platinum layer. Afterward, the substrate is exposed to a mixture of hydrogen peroxide and hydrochloric acid, cleaning any remaining residues of platinum.

In some embodiments, the present methods involve other features described above, such as composition of the mixture of hydrogen peroxide and hydrochloric acid, temperature, concentration, cleaning time, and rapid thermal process conditions.

In some embodiments, the cleaning solution of dilute nitric acid in the first cleaning step does not include chlorine-based acid. The solution can include a non-chlorine chemical, such as a solvent, an acid comprising fluorine (e.g., HF), or an organic acid (e.g., acetic acid or carbonyl acid).

In some embodiments, the post silicidation clean process is selective towards other exposed materials such as $Si_3N_4$ (spacers), $SiO_2$ (field oxide), NiPtSi (contact electrodes), and NiPtSiGe (contact electrodes of source/drain for strain applications).

FIGS. 1A-1E illustrate an illustrative process flow for forming a semiconductor device according to some embodiments of the present invention. In FIG. 1A, a transistor structure 100 is formed on a substrate 110, comprising isolation regions 150 to isolate the neighboring devices, source and drain regions 140A and 140B sandwiching a gate electrode 120 including a gate dielectric 125 and a gate conductor 122. Spacers 130 cover the sidewalls of the gate electrode 120. The substrate 110 can be a semiconductor substrate, or any substrates having a layer of semiconductor material. For example, the substrate 110 can be a single crystal silicon substrate. The substrate 110 can be a silicon-germanium substrate, or can have a silicon germanium layer disposed on top. The gate conductor 122 can comprise doped polysilicon. The top surfaces of the gate electrode 120 and the source and drain regions 140A and 140B may be exposed. FIG. 1A shows an example of a metal-oxide-semiconductor field effect transistor (MOSFET) structure 100, but the invention is not so limited, and can include any transistor structure, such as bipolar transistors, fin transistors or double gate transistors. In addition, the present process flow describes a silicidation process for gate electrode 120 and on source and drain regions 140A and 140B, but the invention is not so limited, and can include silicidation for any combination, for example, for only for the gate electrode 120, or only for the source or drain regions 140A or 140B.

Figure 1B:
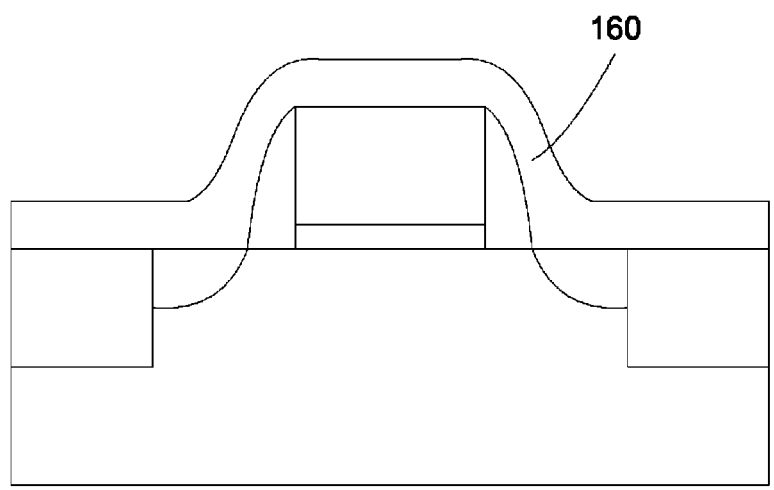

In FIG. 1B, a layer 160 including nickel and platinum is formed on the transistor structure, covering the exposed surfaces of the gate electrode and the source and drain regions. The nickel platinum layer 160 may be deposited using PVD process. The platinum concentration in the layer can be between about 5 wt % and about 15 wt %, for example about 10 wt %. Additional surface preparation can be performed, such as a preclean step with dilute hydrofluoric acid and/or a native oxide removal step for the exposed gate electrode and source/drain regions.

Figure 1C:
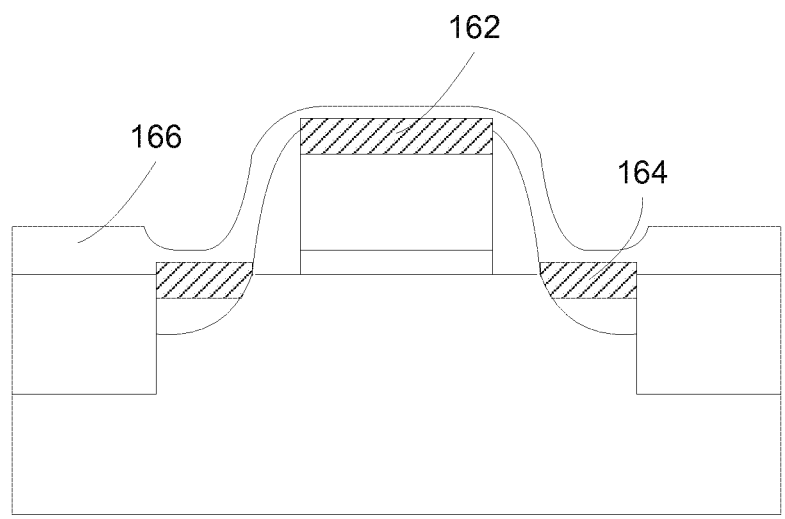

In FIG. 1C, the substrate, together with the transistor structure 100 and the nickel platinum layer 160 is annealed, for example, by a first rapid thermal process, to react nickel and platinum in the nickel platinum layer 160 with the silicon in the gate electrode 120 and source/drain regions 140A/140B.

A nickel platinum silicide layer 162 is formed at the top surface of the gate electrode 120, and nickel platinum silicide layers 164 are formed at the top surface of the source/drain regions. Unreacted nickel platinum layer 166 remains in areas protected by the spacers and the isolation regions 150, and can include excess nickel platinum remaining after the rapid thermal reaction. The first rapid thermal process can involve an anneal in nitrogen environment, at temperature lower than about 380 C for less than a minute. For example, a preferred rapid thermal process comprises annealing at about 300 C for about 30 seconds. The first rapid thermal process can react nickel and platinum with silicon to form various phases of nickel platinum silicide, for example, high resistive phases of mono-nickel platinum silicide or di-nickel platinum silicide.

Figure 1D:
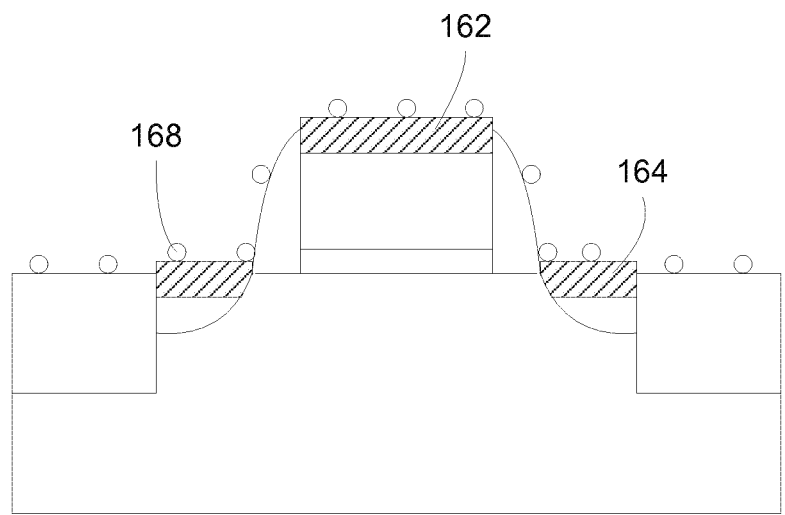

In FIG. 1D, the substrate surface, including unreacted nickel platinum layer 166, together with nickel platinum silicide layers 162, 164 at the gate electrode and the source/drain regions, are exposed to a first cleaning solution comprising dilute nitric acid. In some embodiments, the first cleaning solution contains only dilute nitric acid, i.e., nitric acid diluted in water. In some embodiments, the first cleaning solution comprises dilute nitric acid and a non-chlorine based acid. The exclusion of a chlorine based acid, such as hydrochloric acid, can serve to reduce potential damage caused by the chlorine based acid after the first rapid thermal process. For example, the first solution can include a solvent, an acid containing fluorine, or an organic acid (e.g., an acid containing carbon).

In some embodiments, the concentration of the dilute nitric acid in the first cleaning solution is less than about 15 wt %, or more specifically less than about 10 wt % or about 7 wt %. In some embodiments, the dilute nitric acid concentration can be greater than about 3 wt %. The low concentration of nitric acid can effectively remove unreacted nickel, without damaging the transistor device, such as without damaging the underlying substrates comprising TiN, SiN, and $SiO_2$.

In some embodiments, the first cleaning step is performed for about 5 minutes at a temperature of about 40 C, followed by a water rinse at a temperature of about 25 C (e.g., room temperature) for about 2 minutes. After the first cleaning with dilute nitric acid solution, some of the nickel is removed and some platinum is oxidized, leaving some remaining residues 168 of nickel, platinum, oxidized platinum, and nickel platinum compounds. In some embodiments, the first rapid thermal process and/or the first cleaning are optional.

Figure 1E:
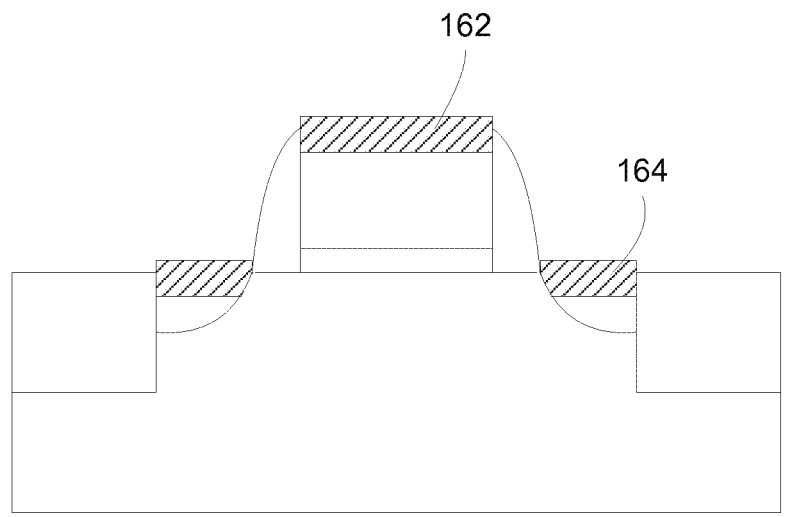

In FIG. 1E, the substrate is annealed, for example, by a second rapid thermal process, to further reduce the resistance of the nickel platinum silicide. For example, the high resistive phases of mono-nickel platinum silicide or di-nickel platinum silicide can further react with silicon to form a low resistive phase of nickel platinum di-silicide. The second rapid thermal process can involve an anneal in nitrogen ambient, at temperature higher than about 300 C for less than a minute. For example, a rapid thermal process may involve annealing at about 450 C for about 30 seconds.

After the second rapid thermal process, the substrate is treated with a second cleaning solution including dilute aqua regia. The dilute aqua regia can remove remaining nickel, oxidize remaining platinum, dissolve oxidized platinum, and in general, clean the surface of residues of nickel, platinum and nickel platinum compounds. As discussed above, the aqua regia is preferably diluted, for example, up to 2× more dilute than prior art aqua regia solution for cleaning nickel platinum residues. The present diluted aqua regia solution can reduce damage to the transistor devices, and can still be effective in removing nickel platinum residues.

In some embodiments, the dilute aqua regia comprises about 7 wt % nitric acid and about 20 wt % hydrochloric acid. In some embodiments, the dilute aqua regia contains about 14 wt % nitric acid and about 15 wt % hydrochloric acid. In some embodiments, the aqua regia cleaning is performed for about 5 minutes at temperature about 40 C, followed by a water rinse at 25 C (e.g., room temperature) for about 2 minutes.

In some embodiments, the substrate is treated with a third cleaning solution to further remove any remaining nickel and platinum residues, such as a cleaning solution containing a mixture of hydrogen peroxide and hydrochloric acid. For example, a solution containing a mixture of hydrogen peroxide and hydrochloric acid can be applied on the surface for less than about 30 minutes, more specifically for less than about 5 minutes, at temperature less than or equal about 80 C, and can be between about 60 C to about 100 C. In some embodiments, the concentration of hydrogen peroxide and hydrochloric acid in the mixture of hydrogen peroxide and hydrochloric acid can be less than or equal to about 25 wt %.

In some embodiments, the described multiple step cleaning using dilute nitric acid, dilute aqua regia, and a mixture of hydrogen peroxide and hydrochloric acid can effectively remove nickel, platinum and nickel/platinum residues without damage to the transistor device, such as forming shallow craters devoid of silicide in the Ni(Pt)Si film. Further, the described cleaning process does not attack the different device materials, such as TiN, SiN spacers and $SiO_2$. The described cleaning solutions further have additional advantages of prolonged shelf life, for example, up to several months, due to the dilute concentration of nitric acid and aqua regia. Dilute nitric acid can be easier to use than concentrated nitric acid, and compared to prior art solutions, such as SPM. In general, dilute nitric acid does not attack platinum, e.g., the portion of platinum oxidation states, e.g., $Pt^+$ or $Pt^{3+}$, that are difficult to dissolve in hydrochloric acid can be much smaller than the portion of platinum oxidation state, e.g., $Pt^{4+}$, that are more soluble in hydrochloric acid.

In some embodiments, the described cleaning solutions can improve nickel and platinum residue removal, especially at high concentrations of platinum (e.g., >5 wt % platinum in nickel platinum layer).

Figure 2:
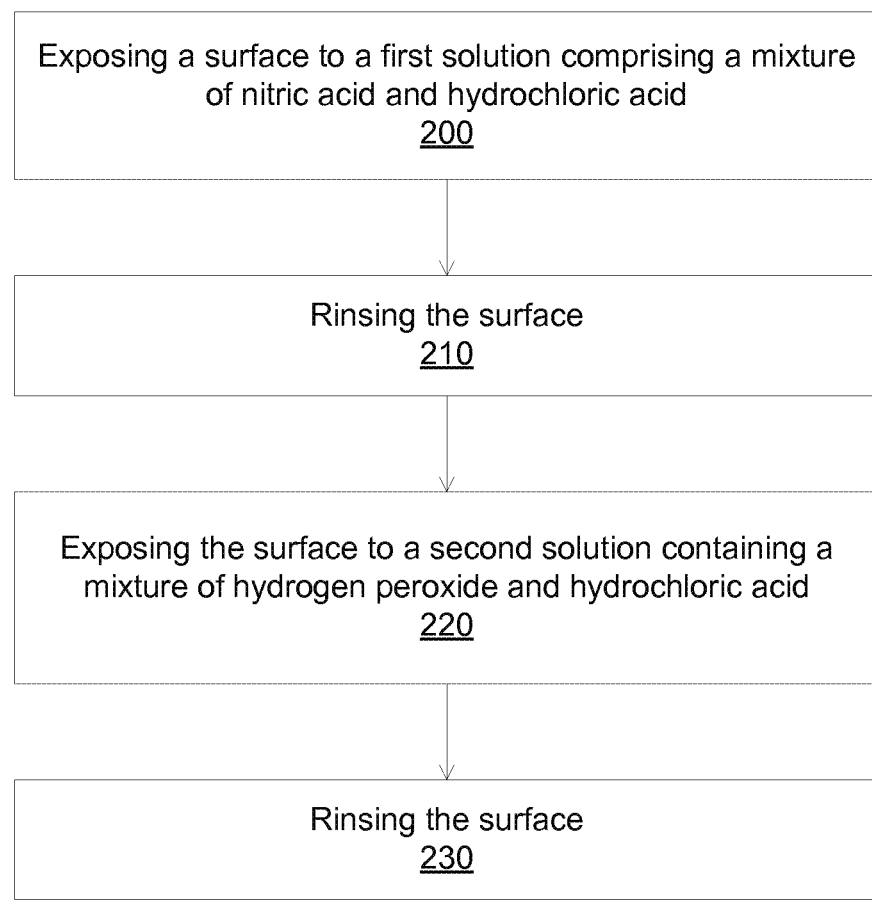
FIG. 2 illustrates an illustrative process flowchart for cleaning a surface according to some embodiments of the present invention.

FIG. 2 illustrates a process flowchart for cleaning a surface according to some embodiments. Operation 200 exposes a surface to a first solution comprising a mixture of nitric acid and hydrochloric acid. Operation 210 rinses the surface. Operation 220 exposes the surface to a second solution containing a mixture of hydrogen peroxide and hydrochloric acid. Operation 230 rinses the surface.

Figure 3:
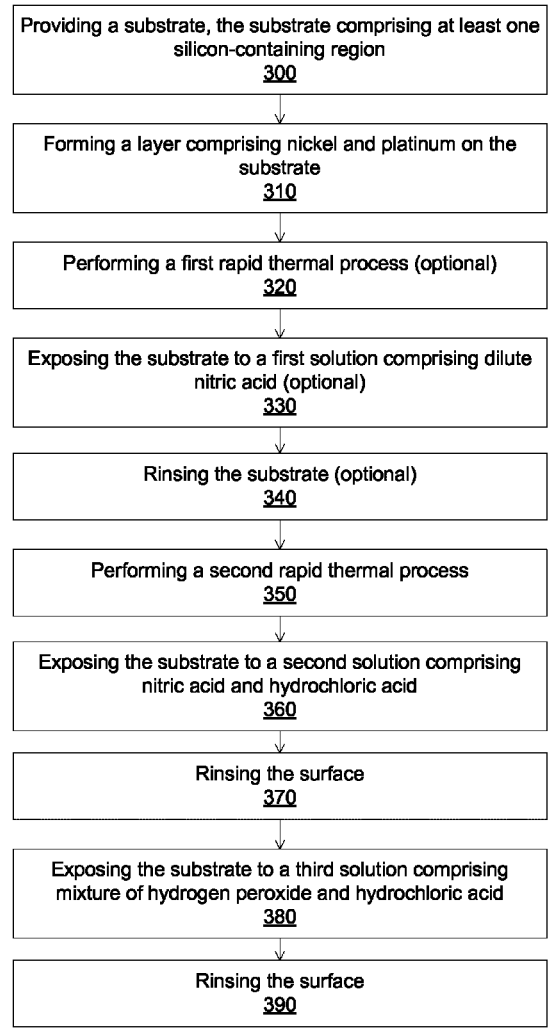
FIG. 3 illustrates an illustrative process flowchart for forming a nickel platinum silicide according to some embodiments of the present invention.

FIG. 3 illustrates a process flowchart for forming a nickel platinum silicide according to some embodiments. Operation 300 provides a substrate that includes at least one silicon-containing region. Operation 310 forms a layer including nickel and platinum on the substrate. Operation 320 optionally performs a first rapid thermal process. Operation 330 optionally exposes the substrate to a first solution comprising dilute nitric acid. Operation 340 optionally rinses the substrate. Operation 350 performs a second rapid thermal process. Operation 360 exposes the substrate to a second solution comprising nitric acid and hydrochloric acid. Operation 370 rinses the surface. Operation 380 exposes the substrate to a third solution comprising a mixture of hydrogen peroxide and hydrochloric acid. Operation 390 rinses the surface.

Figure 4:
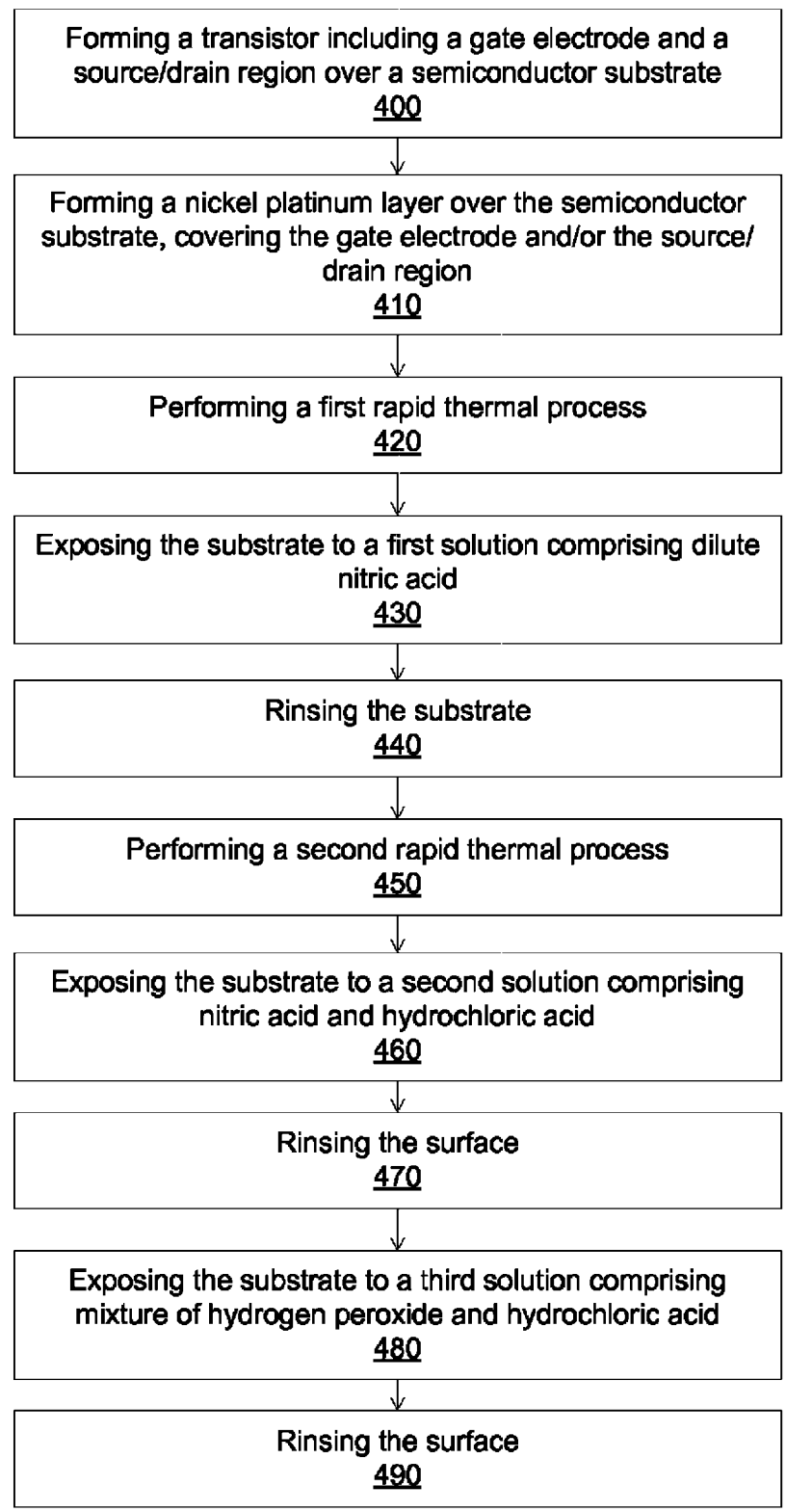
FIG. 4 illustrates an illustrative process flowchart for forming a semiconductor device according to some embodiments of the present invention.

FIG. 4 illustrates a process flowchart for forming a semiconductor device according to some embodiments. Operation 400 forms a transistor including a gate electrode and a source/drain region over a semiconductor substrate. Operation 410 forms a nickel platinum layer over the semiconductor substrate, covering the gate electrode and/or the source/drain region. Operation 420 performs a first rapid thermal process Operation 430 exposes the substrate to a first solution comprising dilute nitric acid. Operation 440 rinses the substrate. Operation 450 performs a second rapid thermal process. Operation 460 exposes the substrate to a second solution comprising nitric acid and hydrochloric acid. Operation 470 rinses the surface. Operation 480 exposes the substrate to a third solution comprising mixture of a hydrogen peroxide and hydrochloric acid. Operation 490 rinses the surface.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A formulation for processing nickel platinum, the formulation comprising:
   water;
   nitric acid mixed with the water; and
   an organic acid mixed with the water and the nitric acid, the organic acid comprising carbonyl acid,
   wherein a concentration of the nitric acid in the formulation is less than about 15 wt %.

2. The formulation of claim 1, wherein the concentration of the nitric acid in the formulation is between about 3 wt % and about 10 wt %.

3. The formulation of claim 2, wherein the concentration of the nitric acid in the formulation is about 7 wt %.

4. The formulation of claim 3, wherein a temperature of the formulation is about 40° C.

5. The formulation of claim 2, wherein the formulation does not comprise a chlorine-based acid.

6. A formulation for processing nickel platinum, the formulation comprising:
   water;
   nitric acid mixed with the water; and
   carbonyl acid mixed with the water and the nitric acid,
   wherein a concentration of the nitric acid in the formulation is between about 3 wt % and about 10 wt %.

7. The formulation of claim 6, wherein the concentration of the nitric acid in the formulation is about 7 wt %.

8. The formulation of claim 7, wherein a temperature of the formulation is between about 60° C. and about 100° C.

9. The formulation of claim 8, wherein the temperature of the formulation is between about 60° C. and about 80° C.

10. A formulation for processing nickel platinum, the formulation comprising of:
    water;
    nitric acid mixed with the water; and
    carbonyl acid mixed with the water and the nitric acid,
    wherein a concentration of the nitric acid in the formulation is less than about 15 wt %.

11. The formulation of claim 10, wherein a concentration of the nitric acid in the formulation is less than about 10 wt %.

12. The formulation of claim 11, wherein a concentration of the nitric acid in the formation is greater than about 3 wt %.

13. The formulation of claim 12, wherein a temperature of the formulation is about 60° C. and about 80° C.

* * * * *